(12) United States Patent
Koyama et al.

(10) Patent No.: US 6,870,182 B2
(45) Date of Patent: Mar. 22, 2005

(54) ORGANIC SEMICONDUCTOR DEVICE

(75) Inventors: Tomoko Koyama, Suwa (JP); Takeo Kaneko, Suwa (JP); Taketomi Kamikawa, Suwa (JP); Norio Oguchi, Suwa (JP); Atsushi Harada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/286,902

(22) Filed: Nov. 4, 2002

(65) Prior Publication Data

US 2003/0085398 A1 May 8, 2003

(30) Foreign Application Priority Data

Nov. 6, 2001 (JP) ........................................ 2001-340671

(51) Int. Cl.⁷ ........................... H01L 35/24; H01L 29/76
(52) U.S. Cl. ........................... 257/40; 257/330; 257/332
(58) Field of Search ........................... 257/40, 330, 332, 257/288, 347, 354, 396, 397, 66, 77

(56) References Cited

U.S. PATENT DOCUMENTS

| | | | | |
|---|---|---|---|---|
| 6,150,668 A | * | 11/2000 | Bao et al. ...................... 257/40 |
| 6,335,539 B1 | * | 1/2002 | Dimitrakopoulos et al. .. 257/40 |
| 6,501,133 B1 | * | 12/2002 | Fujiwara ...................... 257/347 |
| 6,548,859 B2 | * | 4/2003 | Maegawa .................... 257/327 |
| 2002/0155729 A1 | * | 10/2002 | Baldwin et al. ............ 438/780 |

FOREIGN PATENT DOCUMENTS

| JP | A 63-70257 | 3/1988 |
|---|---|---|
| JP | A 63-175860 | 7/1988 |
| JP | A 2-135359 | 5/1990 |
| JP | A 2-135361 | 5/1990 |
| JP | A 3-152184 | 6/1991 |
| JP | A 8-248276 | 9/1996 |
| JP | A 10-153967 | 6/1998 |

OTHER PUBLICATIONS

Solid State Physics, 36 vol. 3, p. 139–146 (2001).

* cited by examiner

*Primary Examiner*—Jerome Jackson
*Assistant Examiner*—Joseph Nguyen
(74) *Attorney, Agent, or Firm*—Oliff & Berridge, PLC

(57) ABSTRACT

An organic semiconductor device of the present invention has an organic semiconductor layer disposed within a depression formed in a substrate; a drain electrode and a source electrode; and a gate electrode to face the organic semiconductor layer with a gate insulating layer interposed. Alternatively, an organic semiconductor device of the present invention has an insulating layer disposed on a substrate; an organic semiconductor layer disposed within a depression formed in the insulating layer; a drain electrode and a source electrode; and a gate electrode disposed to face the organic semiconductor layer with a gate insulating layer interposed.

25 Claims, 14 Drawing Sheets

US 6,870,182 B2

ORGANIC SEMICONDUCTOR DEVICE

Japanese Patent Application No. 2001-340671, filed on Nov. 6, 2001, is hereby incorporated by reference in its entirety.

BACKGROUND OF THE INVENTION

The present invention relates to an organic semiconductor device using an organic semiconductor layer.

Recently, semiconductor integrated circuits are expected to become even more highly integrated and densely packed. However, it is expected that the conventional operating principles for elements will run into limits on the degrees of integration and packing in the near future, so substantially new techniques are required.

BRIEF SUMMARY OF THE INVENTION

The present invention may provide an organic semiconductor device using an organic semiconductor layer.

According to a first aspect of the present invention, there is provided an organic semiconductor device comprising:

an organic semiconductor layer disposed within a depression formed in a substrate;

a drain electrode and a source electrode; and a gate electrode disposed to face the organic semiconductor layer with a gate insulating layer interposed.

According to a second aspect of the present invention, there is provided an organic semiconductor device comprising:

an insulating layer disposed above a substrate;

an organic semiconductor layer disposed within a depression formed in the insulating layer;

a drain electrode and a source electrode; and a gate electrode disposed to face the organic semiconductor layer with a gate insulating layer interposed.

DETAILED DESCRIPTION OF THE EMBODIMENTS

1. First Organic Semiconductor Device

Figure 1A:
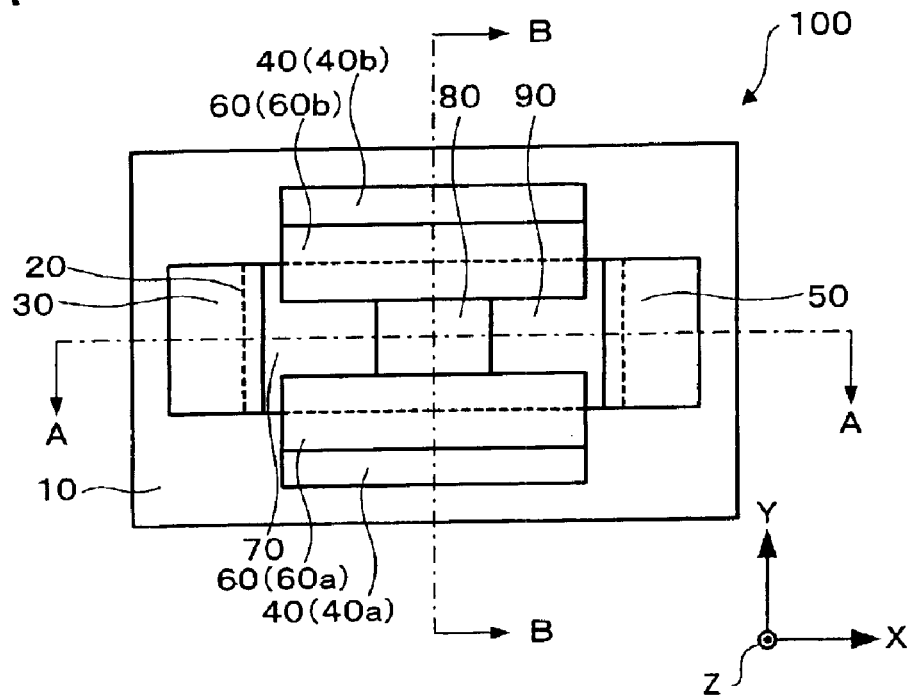
FIG. 1A is a schematic plan view of an organic semiconductor device in accordance with a first embodiment of the present invention.

According to one embodiment of the present invention, there is provided an organic semiconductor device comprising:

an organic semiconductor layer disposed within a depression formed in a substrate;

a drain electrode and a source electrode; and a gate electrode disposed to face the organic semiconductor layer with a gate insulating layer interposed.

In this document, "source electrode" refers to an electrode that emits electrons and "drain electrode" refers to an electrode that takes in electrons.

In this first organic semiconductor device, a field-effect transistor (FET) is formed by the drain electrode, the source electrode, the gate electrode, and the organic semiconductor layer, and a drain current flows between the drain electrode and the source electrode. In other words, a channel region is formed in the organic semiconductor layer sandwiched between the drain electrode and the source electrode. In this case, the length of this channel region is regulated by the film thickness of the organic semiconductor layer.

The first organic semiconductor device of the present invention makes it possible to form the organic semiconductor layer to a predetermined film thickness by setting the width and depth of the depression, and the film thickness of the drain electrode and the source electrode as appropriate. This makes it possible to form a transistor having a desired channel length.

2. Second Organic Semiconductor Device

According to another embodiment of the present invention, there is provided an organic semiconductor device comprising:

an insulating layer disposed above a substrate;

an organic semiconductor layer disposed within a depression formed in the insulating layer;

a drain electrode and a source electrode; and a gate electrode disposed to face the organic semiconductor layer with a gate insulating layer interposed.

In other words, "an insulating layer disposed above a substrate" does not only refer to an insulating layer formed directly on top of the substrate; it also refers to an insulating layer formed above the substrate with a predetermined layer therebetween. As will be described later, this also relates to a case in which "at least part of the insulating layer is disposed above one of the drain electrode and the source electrode", a case in which "one of the source electrode and the drain electrode is disposed above the organic semiconductor layer", a case in which "the organic semiconductor layer is disposed above that electrode disposed above one of the drain and source electrodes", a case in which "the other of the drain electrode and the source electrode is disposed above the organic semiconductor layer", a case in which "the organic semiconductor layer is disposed above the first electrode section", and a case in which "the second electrode section is disposed above the organic semiconductor layer."

In such a case, at least part of the insulating layer could be disposed above the drain electrode or the source electrode; and the source electrode or the drain electrode could be disposed above the organic semiconductor layer. In other words, at least part of the insulating layer could be disposed above the drain electrode, and the source electrode could be disposed above the organic semiconductor layer. Alternatively, at least part of the insulating layer could be disposed above the source electrode, and the drain electrode could be disposed above the organic semiconductor layer.

The second organic semiconductor device of the present invention makes it possible to achieve actions and effects similar to those of the first organic semiconductor device of the present invention described above.

The following features can be provided for the first and second organic semiconductor devices of the present invention:

(A) The organic semiconductor layer may be disposed between the drain electrode and the source electrode.

(B) The drain electrode and the source electrode may be disposed on inner sidewalls of the depression.

(C) One of the drain electrode and the source electrode may be disposed above an inner bottom surface of the depression;

the organic semiconductor layer may be disposed above the electrode disposed above the inner bottom surface; and the other of the drain electrode and the source electrode may be disposed above the organic semiconductor layer.

(D) The gate electrode may be provided on an inner sidewall of the depression.

(E) The gate electrode may comprise two gate insulating layers and include a first electrode section and a second electrode section; and the organic semiconductor layer may be disposed between the first electrode section and the second electrode section, with the two gate insulating layers interposed between the organic semiconductor layer and the first electrode section and between the organic semiconductor layer and the second electrode section.

In this case, the first electrode section may be disposed above an inner bottom surface of the depression;

the organic semiconductor layer may be disposed above the first electrode section; and the second electrode section may be disposed above the organic semiconductor layer.

(F) At least one of the drain electrode and the source electrode may be embedded in the substrate.

(G) The gate electrode may be embedded in the substrate.

(H) The direction of a current flowing between the drain electrode and the source electrode may be parallel to a surface direction of the substrate. The surface direction of the substrate is the direction parallel to the surface in which the depression is formed.

(I) The direction of a current flowing between the drain electrode and the source electrode may be perpendicular to an inner bottom surface of the depression.

An organic semiconductor device in accordance with the present invention can be used in various electronic instruments. Examples of such electronic instruments include electronic books, personal computers, mobile phones, digital cameras, electronic paper, electronic notebooks, liquid-crystal televisions, viewfinder-type or direct-monitor-types of video recorders, car-navigation devices, pagers, electronic organizers, calculators, dedicated wordprocessors, workstations, TV phones, POS terminals, IC cards, mini-disc players, and appliances provided with touch panels.

The description now turns to some of the materials that can be used in components of the organic semiconductor device in accordance with the present invention. These materials are not limited to known materials and thus it should be obvious that materials that are not cited here can also be selected.

3. Organic Semiconductor Layer

In accordance with the present invention, the organic semiconductor layer is a layer comprising at least an organic semiconductor material. More specifically, the organic semiconductor layer of the present invention is an organic layer comprising this organic semiconductor material. This organic semiconductor material could be selected from known chemical compounds. A known conductive high-molecular element could be cited as such an organic semiconductor material. This conductive high-molecular element could be polyacetylene, poly(p-phenylenesulfide), poly(p-phenylenevinylene), polypyrrole, polythiophene, polyaniline, or polyacene, as disclosed in Solid State Physics 36 volume 3, pages 139 to 146 (2001). The conductive high-molecular element.

In addition to anthracene, tetracene, and pentacene disclosed in the above periodical, examples of such organic semiconductor materials include aromaticdiamine derivatives (TPD), oxydiazole derivatives (PBD), oxydiazole dimer (OXD-8), distryryl arylene derivatives (DSA), beryllium-benzoquinolinol complexes (Bebq), triphenylamine derivatives (MTDATA), rubrene, quinacridone, triazole derivatives, polyphenylene, polyalkylfluorene, polyalkylthiophene, azomethine-zinc complexes, porphyrin-zinc complexes, benzoxazole-zinc complexes, and phenantroline-europium complexes as disclosed by way of example in Japanese Patent Application Laid-Open No. 10-153967.

More specifically, known materials disclosed in Japanese Patent Application Laid-Open Nos. 63-70257, 63-175860, 2-135361, 2-135359, 3-152184, and also 8-248276 and 10-153967 can be used as the organic semiconductor material. These chemical compounds can be used independently or two or more of them can be used in combination.

The organic semiconductor layer of the present invention is an organic layer comprising one of the above-described organic semiconductor materials. More specifically, the organic semiconductor layer of the present invention includes cases in which the organic semiconductor material is dispersed or dissolved in an organic material.

4. Electrode Layer

For the source electrode, a metal or alloy which has a low work function (4 eV or less, by way of example) and which facilitates the injection of electrons, an electrically conductive chemical compound, or a mixture thereof could be used. The material, disclosed in Japanese Patent Application Laid-Open No. 8-248276 could be used as this electrode material, by way of example.

For the drain electrode, a metal or alloy which has a high work function (4 eV or more, by way of example) an electrically conductive chemical compound, or a mixture thereof could be used. For example, a conductive transparent material such as CuI, ITO, $SnO_2$, or ZnO or a metal such as gold could be used therefor. The gate electrode could be formed of a metal such as Au or Si. If the surface of the gate electrode is oxidized and an insulating layer is formed around the gate electrode, a metal such as Ta, Ti, or Al could be used therefor.

If the organic semiconductor device in accordance with the present invention has the electron transport/injection layer described below, it is preferable that the work function of the material of the source electrode is less than the electron affinity of the material of the electron transport/injection layer.

In addition, if the organic semiconductor device in accordance with the present invention comprises hole transport/injection layer, it is preferable that the ionization potential of the material of the hole transport/injection layer is less than the work function of the material of the drain electrode.

Note that it is also possible to use a metal such as Au as the electrode formation material used in the formation of the drain electrode, the source electrode, and the gate electrode, if those electrodes are formed by embedding the electrode formation material in a plurality of depressions formed in the substrate.

5. Hole Transport/injection Layer

The organic semiconductor device in accordance with the present invention could further comprise a hole transport/injection layer. This hole transport/injection layer has the function of transporting and injecting holes into the organic semiconductor layer. This hole transport/injection layer is disposed between the drain electrode and the organic semiconductor layer. Note that this hole transport/injection layer could be formed of an organic layer.

The material used for forming the hole transport/injection layer could be selected from known hole injection materials for optically conductive materials, or known materials used in the hole transport/injection layers of organic luminescent devices. Something that functions to either inject holes or block electrons could be used in the material of the hole transport/injection layer. Specific examples thereof are given in Japanese Patent Application Laid-Open No. 8-248276, by way of example.

6. Electron Transport/Injection Layer

The organic semiconductor device in accordance with the present invention could further comprise an electron transport/injection layer. This electron transport/injection layer has the function of transporting and injecting electrons into the organic semiconductor layer. This electron transport/injection layer could be disposed between the source electrode and the organic semiconductor layer. Note that this electron transport/injection layer could be formed of an organic layer.

To ensure that an organic layer can function as an electron transport/injection layer, that organic layer could have the function of transferring electrons that have been injected from the source electrode into the organic semiconductor layer, and the material for forming such an organic layer can be selected from known materials. Specific examples thereof are given in Japanese Patent Application Laid-Open No. 8-248276.

The layers of the organic semiconductor device in accordance with the present invention could be formed by known methods. For example, the layers of the organic semiconductor device could be formed by methods suited to the materials thereof, such as a vapor deposition method, a spin-coating method, a laser-beam method, or an ink-jet method.

Specific embodiments to which the present invention is applied are described below.

7. First Embodiment 7.1 Configuration

A schematic plan view of an organic semiconductor device 100 in accordance with a first embodiment of the present invention is shown in FIG. 1A. A schematic section taken along the line A—A of FIG. 1A is shown in FIG. 1B and a schematic section taken along the line B—B of FIG. 1A is shown in FIG. 1C.

The organic semiconductor device 100 comprises a drain electrode 30, a gate electrode 40, a source electrode 50, and an organic semiconductor layer 80, and these components cause it to operate as a transistor. These layers may be formed from the materials chosen from above-described materials.

Figure 1B:
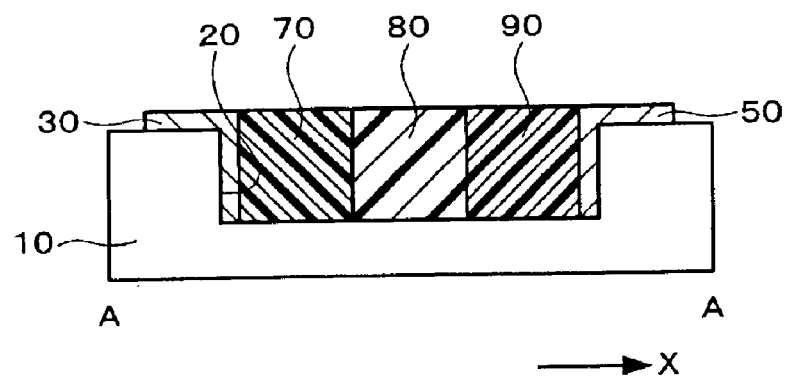
FIG. 1B is a schematic section taken along the line A—A of FIG. 1A.
Figure 1C:
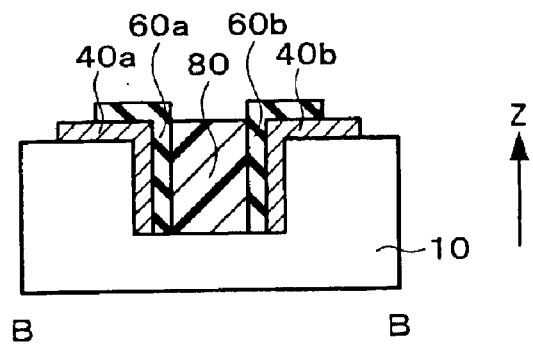
FIG. 1C is a schematic section taken along the line B—B of FIG. 1A.

In this embodiment, a depression 20 is provided in a substrate 10, as shown in FIGS. 1A to 1C. The organic semiconductor layer 80 is disposed in this depression 20. In other words, the organic semiconductor layer 80 is embedded in the depression 20.

The substrate 10 is formed of a material that has superlative insulating properties. Examples of the material of the substrate 10 are limited because of the need for superlative insulating properties, but they include non-organic materials such as glass or organic materials such as polyimides.

As shown in FIGS. 1A to 1C, the shape of the depression 20 in plan is rectangular, but the shape of the depression 20 is not particularly limited and thus it could also have a shape in plan that is polygonal, platform-shaped, circular, or oval, by way of example.

The drain electrode 30 and the source electrode 50 are disposed so as to sandwich the organic semiconductor layer 80. The drain electrode 30 and the source electrode 50 are disposed on inner sidewalls of the depression 20. For that reason, a current flows between the drain electrode 30 and the source electrode 50 in a direction parallel to a surface direction of the substrate 10 (in the direction parallel to the X-Y plane) To enable connections with external pins (not shown in the figure), each of these electrodes is extended up onto the upper surface of the substrate 10, from the corresponding inner sidewall of the depression 20.

The gate electrode 40 is disposed to face the organic semiconductor layer 80 with gate insulating layers 60 (60a and 60b) therebetween. A predetermined voltage is applied to this gate electrode 40. In the organic semiconductor device 100 of this embodiment, this gate electrode 40 is disposed on the inner sidewalls of the depression 20 and also extends onto the upper surface of the substrate 10, as shown in FIG. 1C. The gate insulating layers 60 are disposed above the inner sidewalls of the depression 20 in such a manner as to cover the gate electrode 40. These gate insulating layers 60 are provided to insulate the gate electrode 40 from the organic semiconductor layer 80. Provided the gate insulating layers 60 can insulate the gate electrode 40 and the organic semiconductor layer 80, their material is not particularly limited but if the gate insulating layers 60 are to be formed of an organic layer, a polyimide could be used therefor, by way of example.

The gate electrode 40 is configured of a first electrode section 40a and a second electrode section 40b. The first electrode section 40a and the second electrode section 40b are disposed at a predetermined spacing, and the organic semiconductor layer 80 is formed within this space as described later. Specifically, the first electrode section 40a and the second electrode section 40b are disposed so as to sandwich the organic semiconductor layer 80, as shown in FIG. 1. In addition, the first electrode section 40a is disposed facing the organic semiconductor layer 80 with the gate insulating layer 60a therebetween, and the second electrode section 40b is disposed facing the organic semiconductor layer 80 with the gate insulating layer 60b therebetween.

The organic semiconductor layer 80 is disposed between the drain electrode 30 and the source electrode 50 so that it is sandwiched between the drain electrode 30 and the source electrode 50, and it is also disposed between the first electrode section 40a and the second electrode section 40b that form the gate electrode 40 so that it is sandwiched between the first electrode section 40a and the second electrode section 40b, as described previously (see FIGS. 1A to 1C).

In the organic semiconductor device 100 of this embodiment, the organic semiconductor layer 80 is disposed in the depression 20 together with a hole transport/injection layer 70 and an electron transport/injection layer 90 that can be provided if necessary, as shown in FIGS. 1A to 1C. In such a case, it would become possible to inject more holes or electrons. Each of the hole transport/injection layer 70 and the electron transport/injection layer 90 can be formed from materials chosen from the above-mentioned materials cited in the section on the means for solving the technical problems.

7.2 Operation

The organic semiconductor device 100 in accordance with this embodiment operates as a transistor due the mechanism described below. Note that the description below assumes that pentacene is used as the organic semiconductor material for forming the organic semiconductor layer 80 of this embodiment. However, this organic semiconductor material is not limited to pentacene and thus similar operation can be expected when any of the above described materials are used.

The organic semiconductor device 100 operates as an n-type transistor or p-type transistor, depending on the voltage applied to the gate electrode 40.

(1) The description first concerns the case in which the organic semiconductor device 100 operates as an n-type transistor.

First of all, a voltage is applied between the source electrode 50 and the drain electrode 30 in a state in which a positive voltage is applied to the gate electrode 40, in such a manner that the potential of the drain electrode 30 is higher than the potential of the source electrode 50. The application of a positive voltage to the gate electrode 40 causes the formation of a channel region in the organic semiconductor layer 80, making it easy for electrons to move in the organic semiconductor layer 80. A current (drain current) therefore flows easily between the drain electrode 30 and the source electrode 50. This puts the transistor into an on state.

If a voltage is applied between the source electrode 50 and the drain electrode 30 in a state in which no voltage is applied to the gate electrode 40, on the other hand, in such a manner that the potential of the drain electrode 30 is higher than the potential of the source electrode 50, no channel region is formed in the organic semiconductor layer 80 and thus it is difficult for electrons to move within the organic semiconductor layer 80. It is therefore difficult for a current to flow between the drain electrode 30 and the source electrode 50. This puts the transistor into an off state.

Thus, when a voltage is applied between the source electrode 50 and the drain electrode 30 in such a manner that the potential of the drain electrode 30 is higher than the potential of the source electrode 50, as described above, the transistor is turned on if a positive voltage is applied to the gate electrode 40 or off if no voltage is applied to the gate electrode 40. In this case, the movement of electrons between the drain electrode 30 and the source electrode 50 causes the organic semiconductor device 100 to operate as an n-type transistor.

(2) The description now concerns the case in which the organic semiconductor device 100 operates as a p-type transistor.

First of all, a voltage is applied between the source electrode 50 and the drain electrode 30 in a state in which a negative voltage is applied to the gate electrode 40, in such a manner that the potential of the drain electrode 30 is higher than the potential of the source electrode 50. This causes the formation of a channel region in the organic semiconductor layer 80, making it easy for holes to move in the organic semiconductor layer 80. A drain current therefore flows between the drain electrode 30 and the source electrode 50. This puts the transistor into an on state.

If a voltage is applied between the source electrode 50 and the drain electrode 30 in a state in which no voltage is applied to the gate electrode 40, on the other hand, in such a manner that the potential of the drain electrode 30 is higher than the potential of the source electrode 50, no channel region is formed in the organic semiconductor layer 80 and thus it is difficult for holes to move in the organic semiconductor layer 80. It is therefore difficult for a current to flow between the drain electrode 30 and the source electrode 50. This puts the transistor into an off state.

Thus, when a voltage is applied between the source electrode 50 and the drain electrode 30 in such a manner that the potential of the drain electrode 30 is higher than the potential of the source electrode 50, as described above, the transistor is turned on if a negative voltage is applied to the gate electrode 40 or off if no voltage is applied to the gate electrode 40. In this case, the movement of holes between the drain electrode 30 and the source electrode 50 causes the organic semiconductor device 100 to operate as a p-type transistor.

Note that if a material other than pentacene is used as the organic semiconductor material of the organic semiconductor layer 80, the function will be that of a p-type transistor in case (1) above or an n-type transistor in case above (2).

7.3 Fabrication Method

Figure 2A:
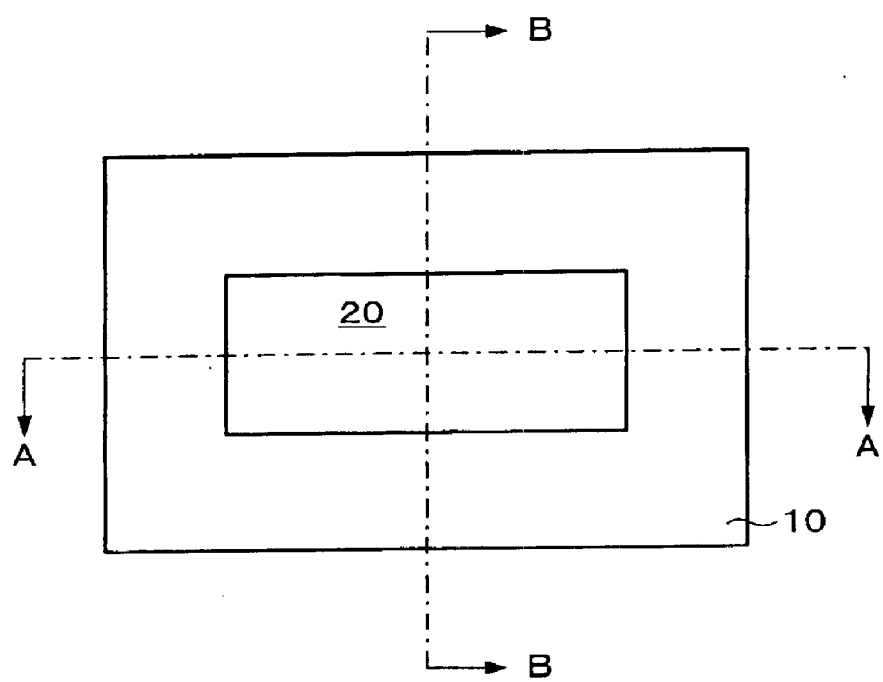
FIG. 2A is a schematic plan view showing a step in the fabrication of the organic semiconductor device of FIGS. 1A to 1C.
Figure 2B:
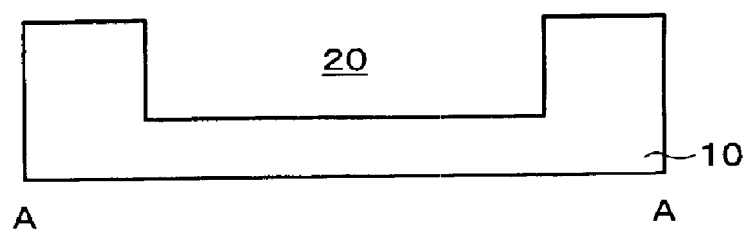
FIG. 2B is a schematic section taken along the line A—A of FIG. 2A.
Figure 2C:
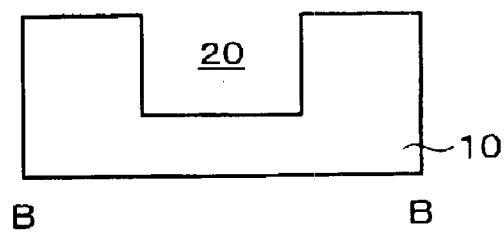
FIG. 2C is a schematic section taken along the line B—B of FIG. 2A.
Figure 3A:
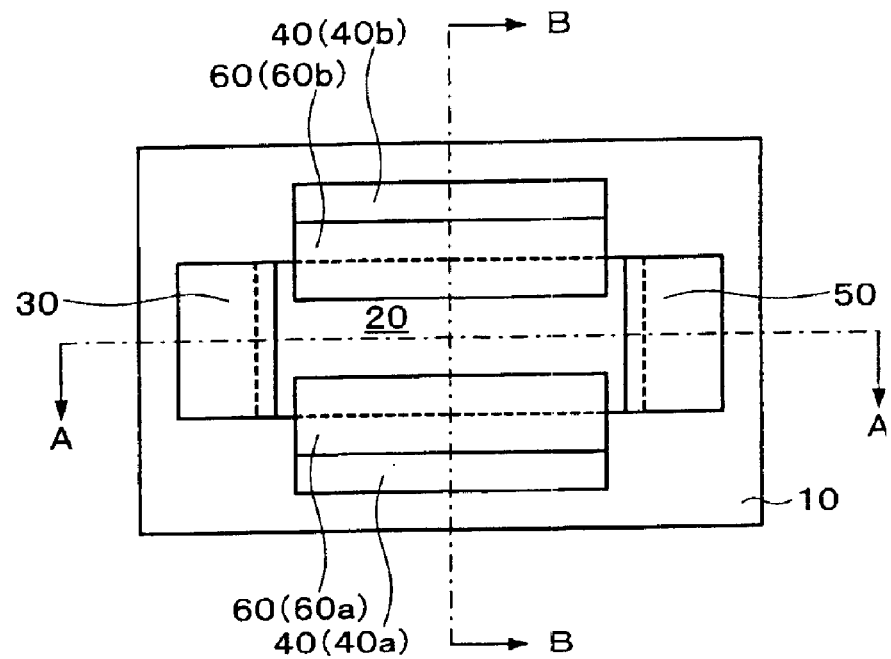
FIG. 3A is a schematic plan view showing another step in the fabrication of the organic semiconductor device of FIGS. 1A to 1C.
Figure 3B:
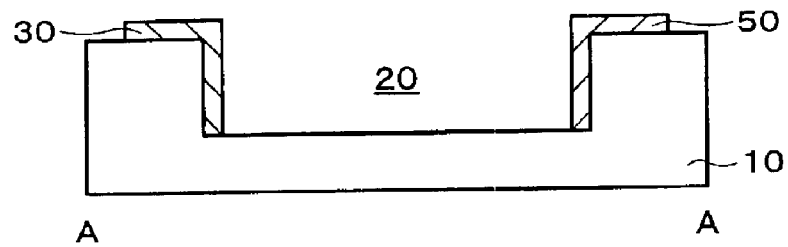
FIG. 3B is a schematic section taken along the line A—A of FIG. 3A.
Figure 3C:
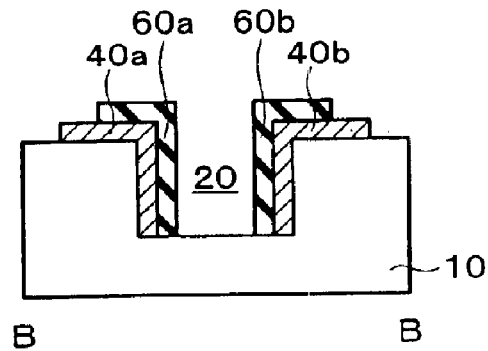
FIG. 3C is a schematic section taken along the line B—B of FIG. 3A.

The description now turns to the method of fabricating the organic semiconductor device 100 of this embodiment, with reference to FIGS. 2A to 2C and FIGS. 3A to 3C. Schematic plan views of steps in the fabrication of the organic semiconductor device 100 of FIGS. 1A to 1C are shown in FIGS. 2A and 3A. A schematic section taken along the line A—A of FIG. 2A is shown in FIG. 2B and a schematic section taken along the line B—B of FIG. 2A is shown in FIG. 2C. Similarly, a schematic section taken along the line A—A of FIG. 3A is shown in FIG. 3B and a schematic section taken along the line B—B of FIG. 3A is shown in FIG. 3C.

(1) First of all, the depression 20 is formed in the substrate 10, as shown in FIGS. 2A to 2C. The method used for forming the depression 20 is not particularly limited, but is selected as appropriate to suit the material of the substrate 10. If the substrate 10 is made of an organic material such as a polyimide, by way of example, a method such as photolithography or stamping could be used.

(2) The drain electrode 30, the source electrode 50, and the gate electrode 40 (the first electrode section 40a and the second electrode section 40b) are then formed by mask-sputtering on the inner sidewalls of the depression 20, as shown in FIGS. 3A to 3C. Note that this embodiment is described as having these electrodes formed by the same process, but they could equally well be formed by separate processes. In addition, the drain electrode 30 and the source electrode 50 are disposed in such a manner that they face each other, and the first electrode section 40a and the second electrode section 40b that form the gate electrode 40 are disposed in such a manner as to face each other, as shown in FIGS. 3A to 3C.

The gate insulating layer 60a is then formed on the first electrode section 40a of the gate electrode 40 and the gate insulating layer 60b is formed on the second electrode section 40b of the gate electrode 40, as shown in FIG. 3C. The gate insulating layers 60 (60a and 60b) are formed of an organic layer of a polyimide, by way of example. In such a case, the gate insulating layers 60 could be formed by a photolithographic process.

Note that if the gate electrode 40 is to be formed of a metal such as Ta, Ti or Al, the gate insulating layers 60a and 60b could be formed in this process by oxidation of the surfaces of the gate electrode 40, after the gate electrode 40 has been formed on the inner sidewalls of the depression 20.

(3) The hole transport/injection layer 70 is then formed in the depression 20 in such a manner that it is in contact with the drain electrode 30. The electron transport/injection layer 90 is also formed in the depression 20 in such a manner that it is in contact with the source electrode 50. The organic semiconductor layer 80 is then formed by embedding an organic semiconductor material between the hole transport/injection layer 70 and the electron transport/injection layer 90 in the depression 20. Note that the sequence in which the hole transport/injection layer 70, the organic semiconductor layer 80, and the electron transport/injection layer 90 are formed is not particularly restricted.

A method such as an ink-jet method could be used as a method of forming the organic semiconductor layer 80 together with the hole transport/injection layer 70 and the electron transport/injection layer 90 in the depression 20. If an ink-jet method is used to form these layers in the depression 20, the depression 20 plays the role of banks, making it possible to form these layers in a simple manner. The organic semiconductor device 100 (see FIGS. 1A to 1C) is obtained by the above process.

7.4 Actions and Effects

The actions and effects described below can be obtained by the organic semiconductor device 100 of this embodiment.

(1) In the organic semiconductor device 100 of this embodiment, a transistor is formed by the drain electrode 30, the source electrode 50, the gate electrode 40, and the organic semiconductor layer 80, and a drain current flows between the drain electrode 30 and the source electrode 50. In other words, a channel region is formed in the organic semiconductor layer 80 that is sandwiched between the drain electrode 30 and the source electrode 50. If the hole transport/injection layer 70 and the electron transport/injection layer 90 are provided in addition to the organic semiconductor layer 80, as in the organic semiconductor device 100 of this embodiment, the channel region is formed in the hole transport/injection layer 70, the organic semiconductor layer 80, and the electron transport/injection layer 90. In such a case, the length of this channel region is determined by the thicknesses of the hole transport/injection layer 70, the electron transport/injection layer 90, and the organic semiconductor layer 80 (the film thicknesses in the X direction in FIG. 1B) In other words, a transistor having a desired channel length can be formed by setting the width of the depression 20 (the width in the X direction in FIG. 1B) and the film thicknesses of the drain electrode 30 and the source electrode 50 in a suitable manner.

(2) The region in which the drain current flows between the drain electrode 30 and the source electrode 50 can be set in a suitable manner by forming the size of the depression 20 in plan to a predetermined size.

(3) In addition, the drain electrode 30, the source electrode 50, and the gate electrode 40 can be formed by the same process, using a mask-sputtering method. The organic semiconductor layer 80 could be formed by filling the depression 20 with an organic semiconductor material, using an ink-jet method. This would make it possible to simplify the fabrication process.

7.5 Modification

Figure 4A:
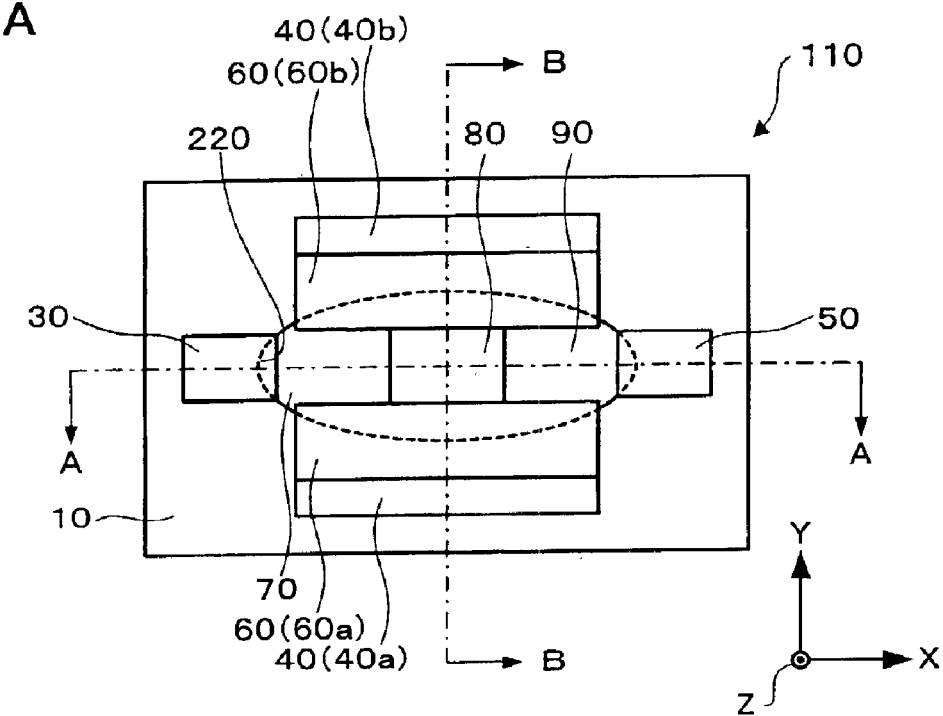
FIG. 4A is a schematic plan view of a modification of the organic semiconductor device in accordance with the first embodiment of the present invention.
Figure 4B:
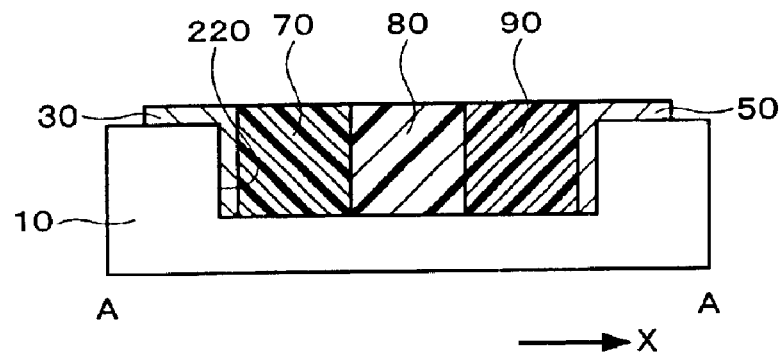
FIG. 4B is a schematic section taken along the line A—A of FIG. 4A.
Figure 4C:
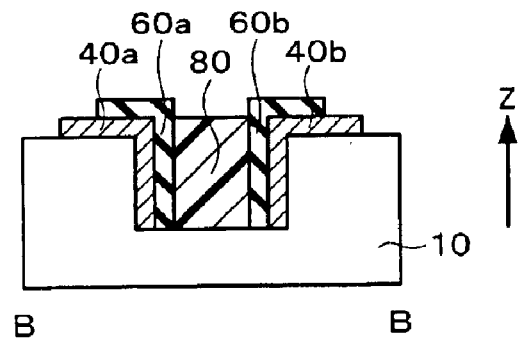
FIG. 4C is a schematic section taken along the line B—B of FIG. 4A.

An organic semiconductor device 110 that is a variation on the organic semiconductor device 100 of this embodiment is shown in FIGS. 4A to 4C. Components that have substantially the same function as components in FIG. 1 are denoted by the same reference numbers and further description thereof is omitted. This organic semiconductor device 110 mainly differs from the organic semiconductor device 100 of the first embodiment in that a depression 220 thereof is oval in plan whereas the depression 20 is rectangular in plan. In other words, it is possible to set the plan shape of the depression as appropriate in the organic semiconductor device of this embodiment, as described previously.

In this organic semiconductor device 110, a current flows in a direction parallel to a surface direction of the substrate 10 between the drain electrode 30 and the source electrode 50, in the same way as in the organic semiconductor device 100 of this embodiment.

The operation together with the actions and effects of the organic semiconductor device 110 are substantially similar to those of the organic semiconductor device 100 of this embodiment, so further description thereof is omitted.

8. Second Embodiment

8.1 Configuration

Figure 5A:
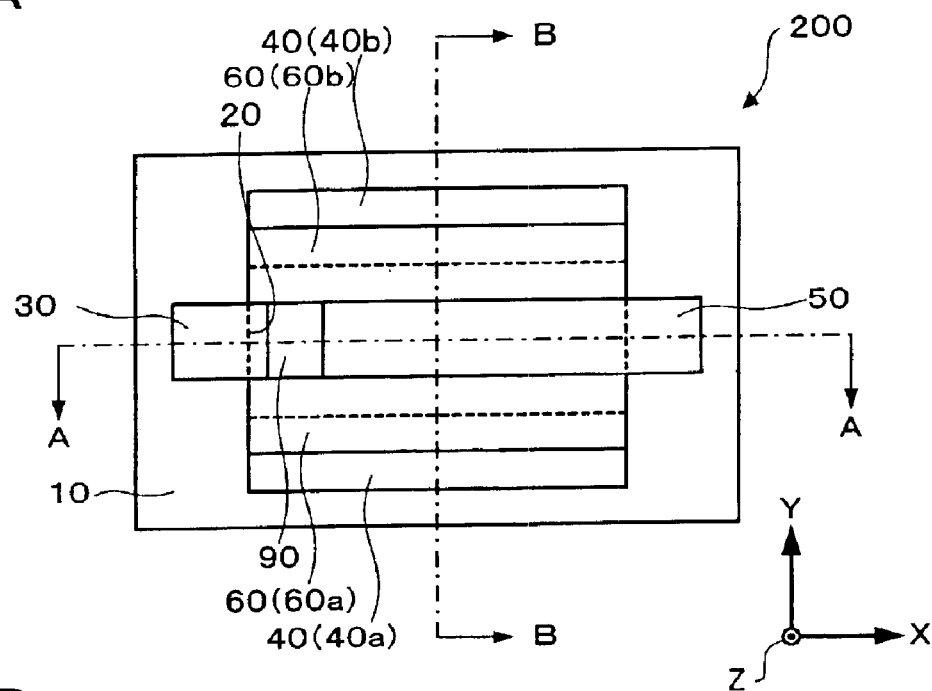
FIG. 5A is a schematic plan view of an organic semiconductor device in accordance with a second embodiment of the present invention.
Figure 5B:
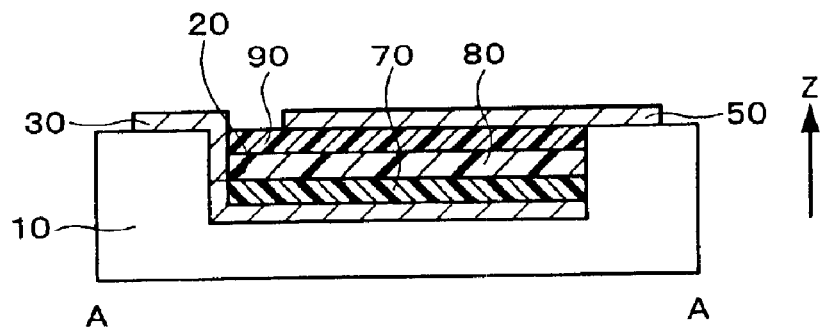
FIG. 5B is a schematic section taken along the line A—A of FIG. 5A.
Figure 5C:
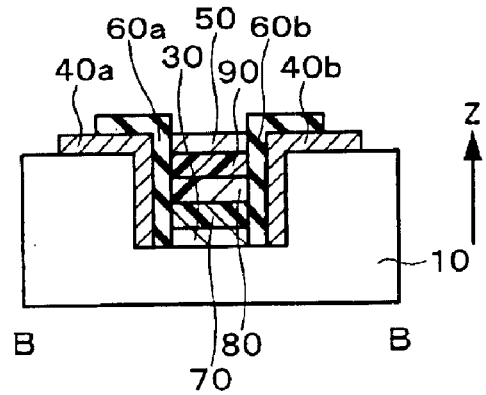
FIG. 5C is a schematic section taken along the line B—B of FIG. 5A.

A schematic plan view of an organic semiconductor device 200 in accordance with a second embodiment of the present invention is shown in FIG. 5A. A schematic section taken along the line A—A of FIG. 5A is shown in FIG. 5B and a schematic section taken along the line B—B of FIG. 5A is shown in FIG. 5C. Components that have substantially the same function as components in FIG. 1 are denoted by the same reference numbers and further description thereof is omitted.

The configuration of this organic semiconductor device 200 is substantially similar to that of the organic semiconductor device 100 of FIG. 1, except that the drain electrode 30 is disposed on the inner bottom surface and one of the inner sidewalls of the depression 20, the source electrode 50 is disposed above the organic semiconductor layer 80, and the hole transport/injection layer 70, the organic semiconductor layer 80, and the electron transport/injection layer 90 are disposed in that order on the drain electrode 30. In other words, this organic semiconductor device 200 has substantially the same configuration as the organic semiconductor device 100 of FIG. 1, in that the source electrode 50 and the drain electrode 30 are disposed so as to sandwich the organic semiconductor layer 80 and the first electrode section 40*a* and the second electrode section 40*b* that form the gate electrode 40 are also disposed so as to sandwich the organic semiconductor layer 80.

In the organic semiconductor device 200 of this embodiment, the drain electrode 30 is disposed on the inner bottom surface of the depression 20. This drain electrode 30 extends on one of the inner sidewalls of the depression 20 as far as the upper surface of the substrate 10. The hole transport/injection layer 70, the organic semiconductor layer 80, and the electron transport/injection layer 90 are formed in that order on the drain electrode 30 in the depression 20. The organic semiconductor layer 80 is therefore disposed on the drain electrode 30 with the hole transport/injection layer 70 therebetween, within the depression 20. The source electrode 50, on the other hand, is disposed on top of the organic semiconductor layer 80 with the electron transport/injection layer 90 therebetween. In this organic semiconductor device 200, a current flows between the drain electrode 30 and the source electrode 50 in a direction perpendicular to the surface of the substrate (the Z direction or the −Z direction).

8.2 Operation

The operation of the organic semiconductor device 200 of this embodiment is substantially the same as that of the organic semiconductor device 100 in accordance with the first embodiment, apart from the way in which the current flows between the drain electrode 30 and the source electrode 50 in a direction perpendicular to the surface of the substrate 10, so further description thereof is omitted.

8.3 Fabrication Method

Figure 6A:
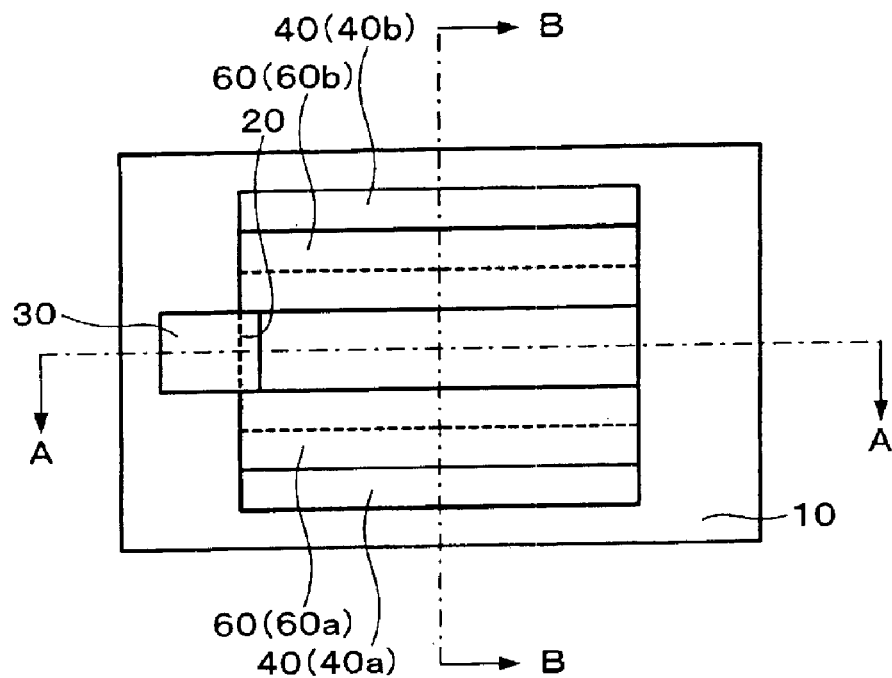
FIG. 6A is a schematic plan view showing a step in the fabrication of the organic semiconductor device of FIGS. 5A to 5C.
Figure 6B:
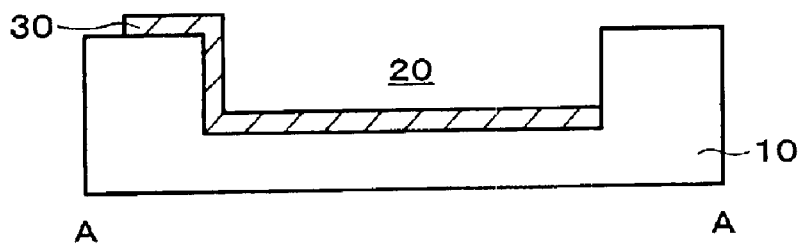
FIG. 6B is a schematic section taken along the line A—A of FIG. 6A.
Figure 6C:
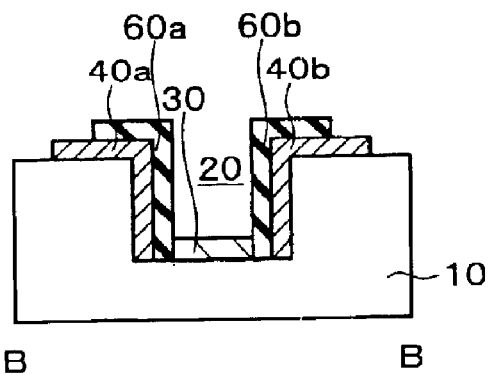
FIG. 6C is a schematic section taken along the line B—B of FIG. 6A.
Figure 7A:
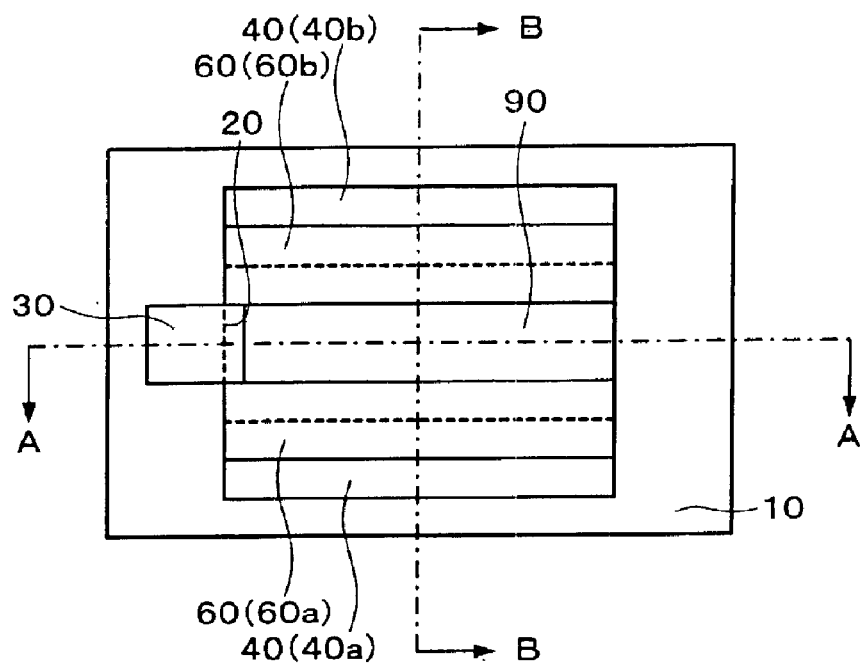
FIG. 7A is a schematic plan view showing another step in the fabrication of the organic semiconductor device of FIGS. 5A to 5C.
Figure 7B:
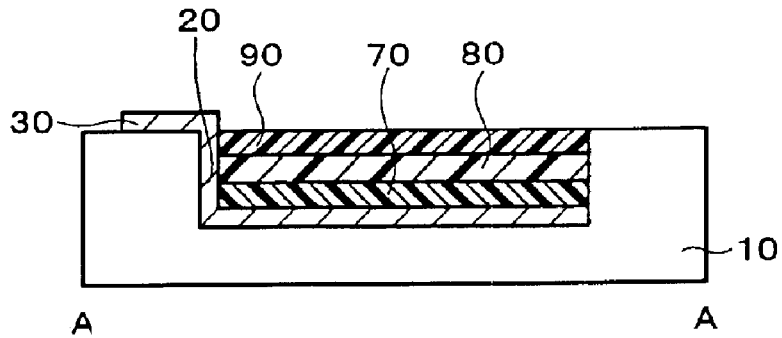
FIG. 7B is a schematic section taken along the line A—A of FIG. 7A.
Figure 7C:
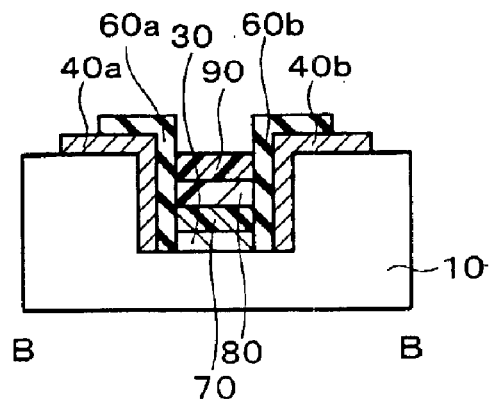
FIG. 7C is a schematic section taken along the line B—B of FIG. 7A.

The description now turns to the method of fabricating the organic semiconductor device 200 of this embodiment, with reference to FIGS. 6A to 6C and FIGS. 7A to 7C. Schematic plan views of steps in the fabrication of the organic semiconductor device 200 of FIGS. 5A to 5C are shown in FIGS. 6A and 7A. A schematic section taken along the line A—A of FIG. 6A is shown in FIG. 6B and a schematic section taken along the line B—B of FIG. 6A is shown in FIG. 6C. Similarly, a schematic section taken along the line A—A of FIG. 7A is shown in FIG. 7B and a schematic section taken along the line B—B of FIG. 7A is shown in FIG. 7C. Note that the description is omitted of steps that are the same as in the fabrication process of the organic semiconductor device 100 of the first embodiment.

(1) First of all, the depression 20 is formed in the substrate 10 (see FIGS. 2A to 2C). The formation of the depression 20 is by a fabrication process that is similar to that of the organic semiconductor device 100 in accordance with the first embodiment, so further description thereof is omitted.

(2) The drain electrode 30 is then formed by a mask-sputtering method on the inner bottom surface and one of the inner sidewalls of the depression 20, as shown in FIGS. 6A to 6C. The gate electrode 40 (the first electrode section 40*a* and the second electrode section 40*b*) is also formed on the inner sidewalls of the depression 20. The method of forming the drain electrode 30 and the gate electrode 40 is similar to the method used in the first embodiment. The gate insulating layer 60*a* is then formed on the first electrode section 40*a* of the gate electrode 40 and the gate insulating layer 60*b* is formed on the second electrode section 40*b* of the gate electrode 40, by a method similar to that of the first embodiment.

(3) The hole transport/injection layer 70, the organic semiconductor layer 80, and the electron transport/injection layer 90 are then formed in that order on the drain electrode 30 in the depression 20 by a method similar to that of the first embodiment, as shown in FIG. 7A to FIG. 7C. The source electrode 50 is formed on the electron transport/injection layer 90 by a method similar to that of the first embodiment. The organic semiconductor device 200 (see FIGS. 5A to 5C) is obtained by the above process.

8.4 Actions and Effects

In the organic semiconductor device 200 of this embodiment, a transistor is formed by the drain electrode 30, the source electrode 50, the gate electrode 40, and the organic semiconductor layer 80, and a drain current flows between the drain electrode 30 and the source electrode 50, in a similar way to the organic semiconductor device 100 in accordance with the first embodiment. In addition, a channel region is formed in the hole transport/injection layer 70, the organic semiconductor layer 80, and the electron transport/injection layer 90 that are sandwiched between the drain electrode 30 and the source electrode 50. In this case, the length of the channel region is determined by the thicknesses of the hole transport/injection layer 70, the electron transport/injection layer 90, and the organic semiconductor layer 80 (the film thicknesses in the Z direction in FIG. 5B). It is therefore possible to form a transistor having a desired channel length by setting the film thicknesses of those layers in a suitable manner.

The hole transport/injection layer 70, the electron transport/injection layer 90, and the organic semiconductor layer 80 are each formed on top of the drain electrode 30 to form a stack. This therefore simplifies the process of forming the multi-layer stack of the organic semiconductor layer 80, the hole transport/injection layer 70, and the electron transport/injection layer 90 in the organic semiconductor device 200 of this embodiment.

The other actions and effects of the organic semiconductor device 200 of this embodiment are substantially the same as those of the organic semiconductor device 100 in accordance with the first embodiment so further description thereof is omitted.

9. Third Embodiment 9.1 Configuration

Figure 8A:
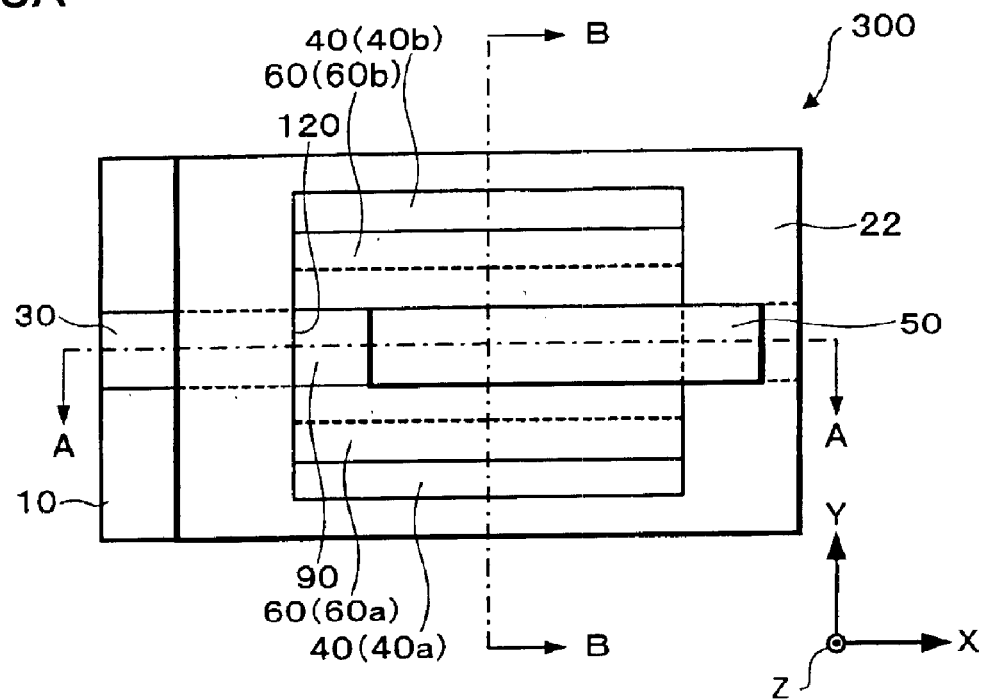
FIG. 8A is a schematic plan view of an organic semiconductor device in accordance with a third embodiment of the present invention.
Figure 8B:
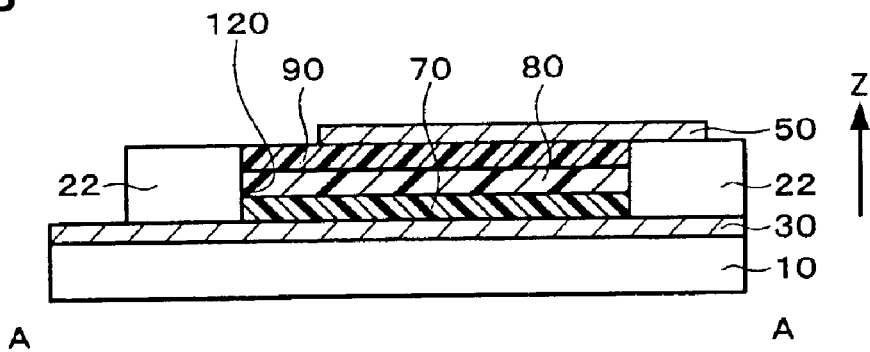
FIG. 8B is a schematic section taken along the line A—A of FIG. 8A.
Figure 8C:
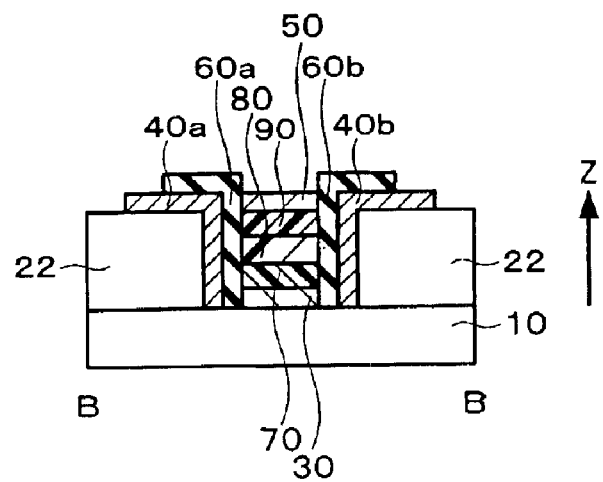
FIG. 8C is a schematic section taken along the line B—B of FIG. 8A.

A schematic plan view of an organic semiconductor device 300 in accordance with a third embodiment of the present invention is shown in FIG. 8A. A schematic section taken along the line A—A of FIG. 8A is shown in FIG. 8B and a schematic section taken along the line B—B of FIG. 8A is shown in FIG. 8C. Components that have substantially the same function as components in FIG. 1 are denoted by the same reference numbers and further description thereof is omitted.

This organic semiconductor device 300 mainly differs from the organic semiconductor device 100 in accordance with the first embodiment (see FIGS. 1A to 1C) in that the drain electrode 30 is disposed on top of the substrate 10 and an insulating layer 22 is disposed on at least part of the drain electrode 30, a depression 120 is formed in this insulating layer 22, and the organic semiconductor layer 80 is formed in this depression 120. In this embodiment, the depression 120 is an opening penetrating through the insulating layer 22. In this organic semiconductor device 300, on the other hand, the configuration is similar to that of the organic semiconductor device 200 in that the hole transport/injection layer 70, the organic semiconductor layer 80, and the electron transport/injection layer 90 are disposed in that order on the drain electrode 30. In other words, the hole transport/injection layer 70, the organic semiconductor layer 80, and the electron transport/injection layer 90 are superimposed in the Z direction in FIG. 8B.

In the organic semiconductor device 300 of this embodiment, the drain electrode 30 is formed on the substrate 10. In the depression 120, the drain electrode 30 is disposed on the inner bottom surface of this depression 120. The hole transport/injection layer 70, the organic semiconductor layer 80, and the electron transport/injection layer 90 are disposed in the depression 120. The drain electrode 30 also extends out to the upper surface of the substrate 10.

The source electrode 50, on the other hand, is disposed on top of the electron transport/injection layer 90. For that reason, a current flows between the drain electrode 30 and the source electrode 50 of the organic semiconductor device 300 in a direction perpendicular to the surface of the substrate 10.

9.2 Operation

The operation of the organic semiconductor device 300 of this embodiment is substantially the same as that of the organic semiconductor device 100 of the first embodiment, except that the current flows in a direction perpendicular to the surface of the substrate 10, so further description thereof is omitted. In other words, the operation of the organic semiconductor device 300 of this embodiment is substantially the same as that of the organic semiconductor device 200 of the second embodiment.

9.3 Fabrication Method

Figure 9A:
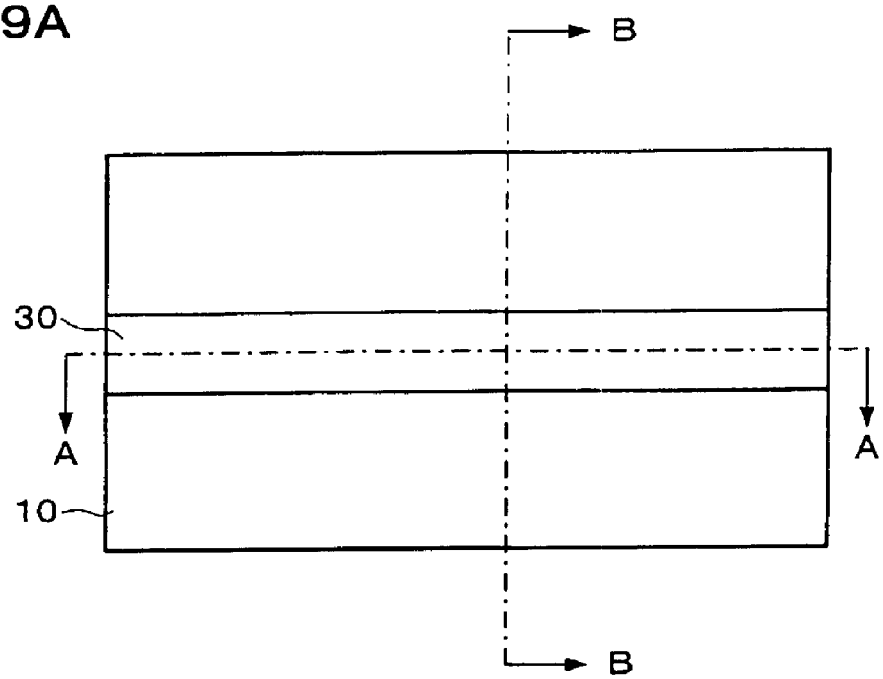
FIG. 9A is a schematic plan view showing a step in the fabrication of the organic semiconductor device of FIGS. 8A to 8C.
Figure 9B:
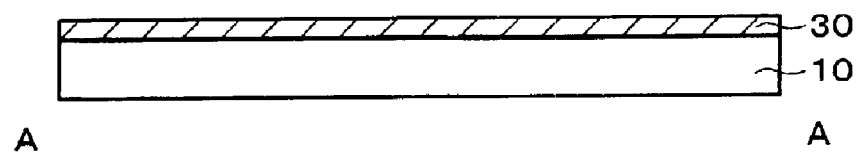
FIG. 9B is a schematic section taken along the line A—A of FIG. 9A.
Figure 9C:
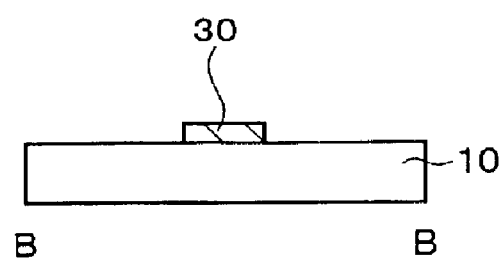
FIG. 9C is a schematic section taken along the line B—B of FIG. 9A.
Figure 10A:
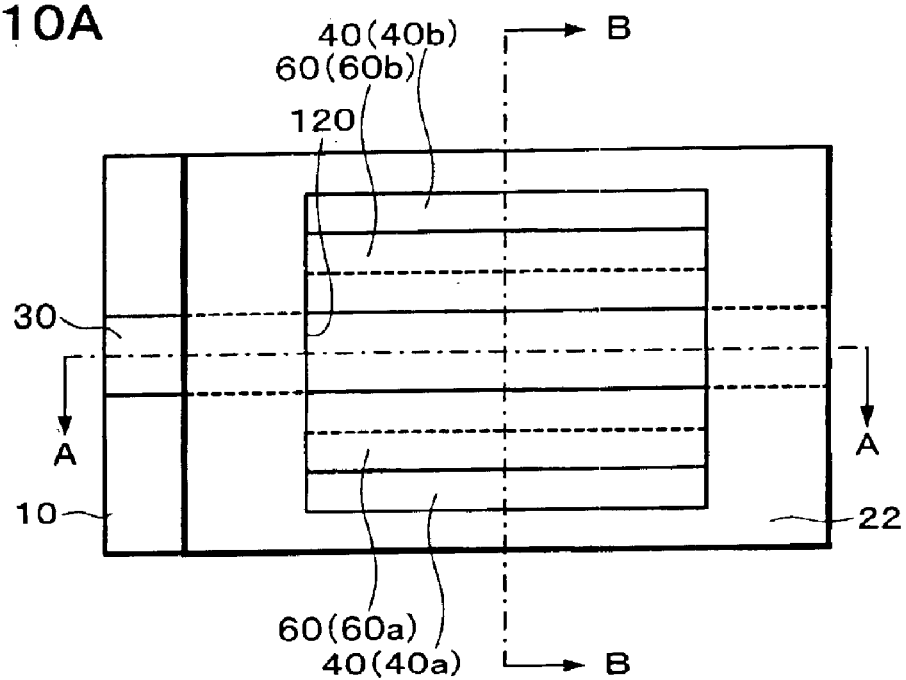
FIG. 10A is a schematic plan view showing another step in the fabrication of the organic semiconductor device of FIGS. 8A to 8C.
Figure 10B:
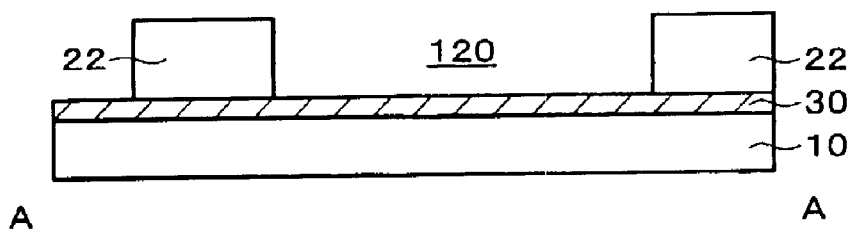
FIG. 10B is a schematic section taken along the line A—A of FIG. 10A.
Figure 10C:
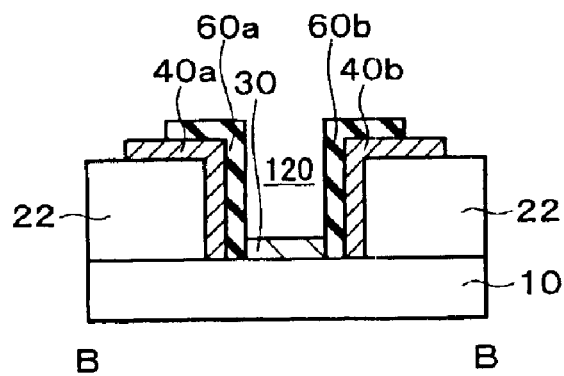
FIG. 10C is a schematic section taken along the line B—B of FIG. 10A.

The description now turns to the method of fabricating the organic semiconductor device 300 of this embodiment, with reference to FIGS. 9A to 9C and FIGS. 10A to 10C. Schematic plan views of steps in the fabrication of the organic semiconductor device 300 of FIGS. 8A to 8C are shown in FIGS. 9A and 10A. A schematic section taken along the line A—A of FIG. 9A is shown in FIG. 9B and a schematic section taken along the line B—B of FIG. 9A is shown in FIG. 9C. Similarly, a schematic section taken along the line A—A of FIG. 10A is shown in FIG. 10B and a schematic section taken along the line B—B of FIG. 10A is shown in FIG. 10C. Note that the description is omitted of steps that are the same as in the fabrication process of the organic semiconductor device 100 of the first embodiment.

(1) First of all, the drain electrode 30 is formed on the substrate 10, as shown in FIGS. 9A to 9C. A method similar to that used for the organic semiconductor device 100 in accordance with the first embodiment is used for forming this drain electrode 30.

(2) The insulating layer 22 having a predetermined depression 120 is then formed on the substrate 10 and the drain electrode 30, as shown in FIGS. 10A to 10C. The depression 120 is formed by a method that is appropriate for the material of the insulating layer 22. If the insulating layer 22 is of an organic material, for example, the depression 120 could be formed by stamping.

(3) After the gate electrode 40 (the first electrode section 40a and the second electrode section 40b) has been formed by mask-sputtering on the inner sidewalls of the depression 120 by a method similar to that of the first embodiment, the gate insulating layer 60a is formed on the first electrode section 40a of the gate electrode 40 and the gate insulating layer 60b is formed on the second electrode section 40b of the gate electrode 40.

(4) The hole transport/injection layer 70, the organic semiconductor layer 80, and the electron transport/injection layer 90 are then formed in that order on the drain electrode 30 within the depression 120, by a method similar to that of the first embodiment. The source electrode 50 is then formed on top of the electron transport/injection layer 90. The organic semiconductor device 300 (see FIGS. 8A to 8C) is obtained by the above process.

9.4 Actions and Effects

The actions and effects of the organic semiconductor device 300 of this embodiment are substantially the same as those of the organic semiconductor device 200 of the second embodiment. In addition, since the drain electrode 30 extends out onto the top of the substrate 10 in the organic semiconductor device 300 of this embodiment, it is simple to derive electrodes when this organic semiconductor device 300 is designed into an array. As a result, it become possible to simplify the fabrication process.

10. Fourth Embodiment 10.1 Configuration

Figure 11A:
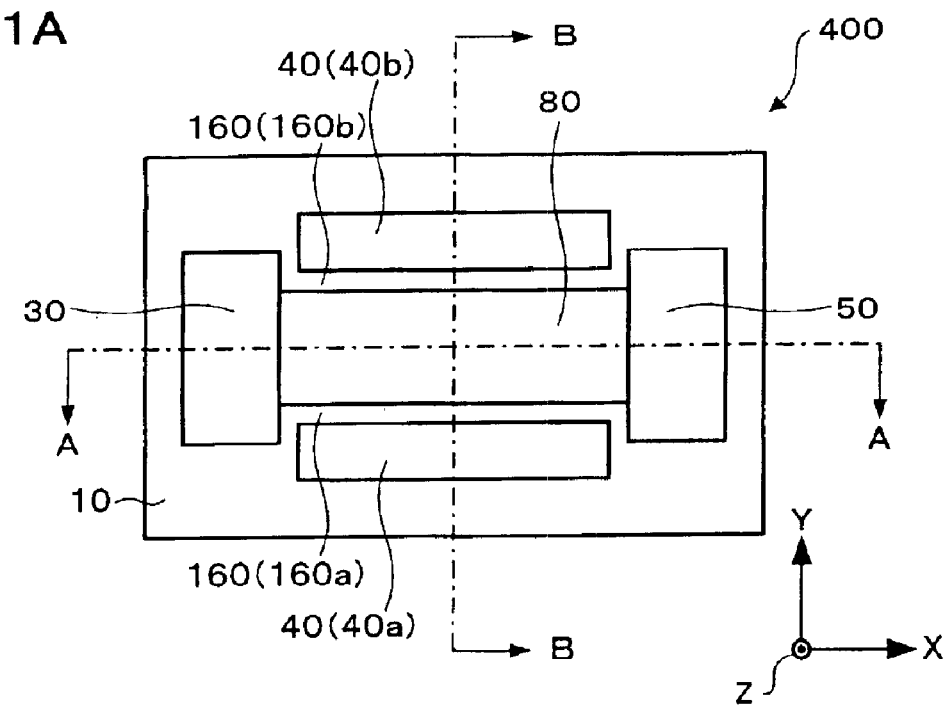
FIG. 11A is a schematic plan view of an organic semiconductor device in accordance with a fourth embodiment of the present invention.
Figure 11B:
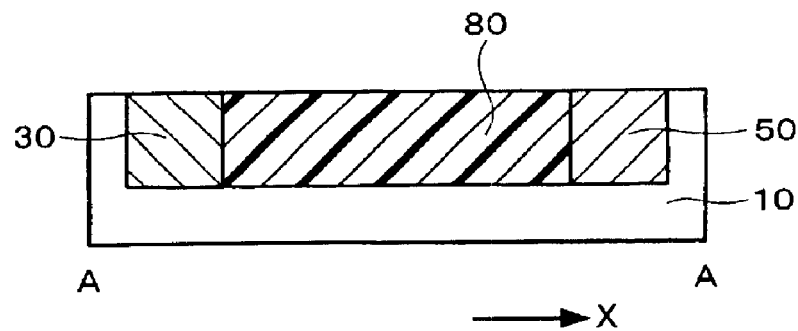
FIG. 11B is a schematic section taken along the line A—A of FIG. 11A.

A schematic plan view of an organic semiconductor device 400 in accordance with a fourth embodiment of the present invention is shown in FIG. 11A. A schematic section taken along the line A—A of FIG. 11A is shown in FIG. 11B and a schematic section taken along the line B—B of FIG. 11A is shown in FIG. 1C. Components that have substantially the same function as components in FIG. 1 are denoted by the same reference numbers and further description thereof is omitted.

This organic semiconductor device 400 has a configuration that mainly differs from that of the organic semiconductor device 100 of the first embodiment (see FIGS. 1A to 1C) in that the drain electrode 30, the source electrode 50, and the gate electrode 40 (40a and 40b) are embedded into the top of the substrate 10. In other words, the drain electrode 30, the source electrode 50, and the gate electrode 40 are formed by embedding suitable materials into depressions provided in the substrate 10, in a similar manner to the organic semiconductor layer 80.

In the organic semiconductor device 400 of this embodiment, the gate electrode 40 is formed of the first electrode section 40a and the second electrode section 40b, in a similar manner to the organic semiconductor device 100 of the first embodiment. The first electrode section 40*a* is disposed facing the organic semiconductor layer 80 with a gate insulating layer 160*a* therebetween. Similarly, the second electrode section 40*b* is disposed facing the organic semiconductor layer 80 with a gate insulating layer 160*b* therebetween. The gate insulating layer 160*a* has the function of insulating the first electrode section 40*a* of the gate electrode 40 from the organic semiconductor layer 80 and the gate insulating layer 160*b* has the function of insulating the second electrode section 40*b* of the gate electrode 40 from the organic semiconductor layer 80. These gate insulating layers 160 (160*a* and 160*b*) are formed by patterning of the substrate 10. These gate insulating layers 160*a* and 160*b* are therefore made of the same material as the substrate 10.

In the organic semiconductor device 400 of this embodiment, a current flows between the drain electrode 30 and the source electrode 50 in a direction parallel to a surface direction of the substrate 10 (shown in FIGS. 12A–12C), in a similar manner to the organic semiconductor device 100 in accordance with the first embodiment.

10.2 Operation

The operation of the organic semiconductor device 400 of this embodiment is substantially the same as that of the organic semiconductor device 100 in accordance with the first embodiment, so further description thereof is omitted.

10.3 Fabrication Method

Figure 11C:
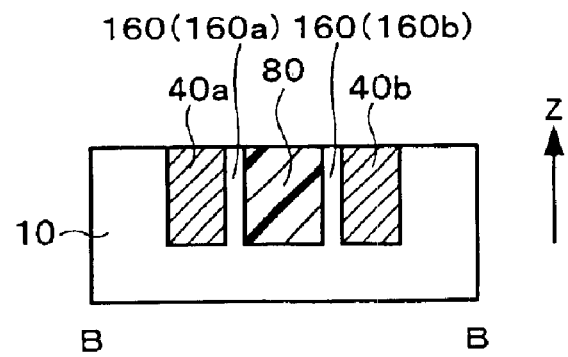
FIG. 11C is a schematic section taken along the line B—B of FIG. 11A.
Figure 12A:
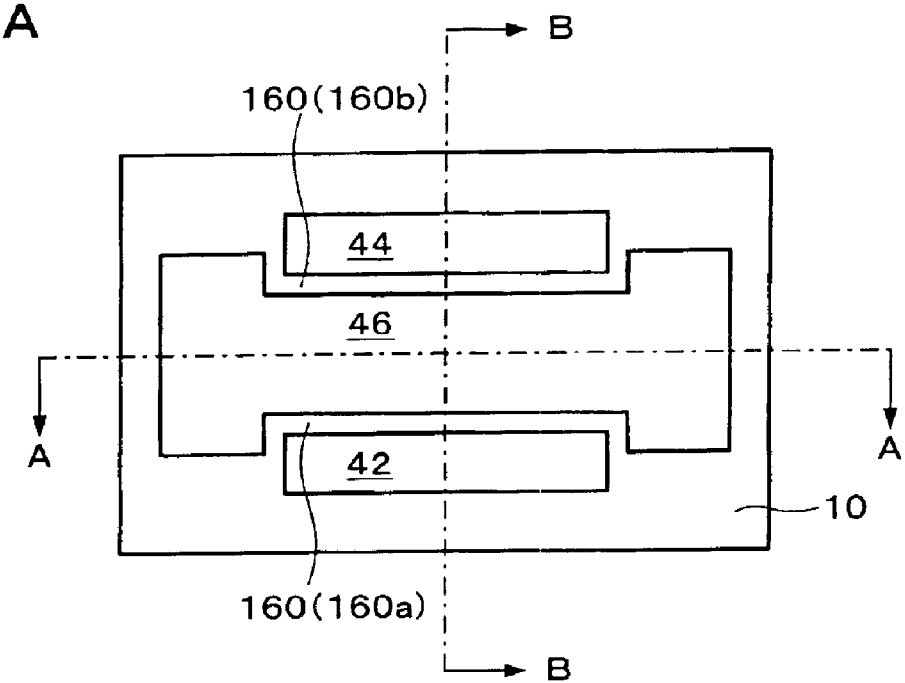
FIG. 12A is a schematic plan view showing a step in the fabrication of the organic semiconductor device of FIGS. 11A to 11C.
Figure 12B:
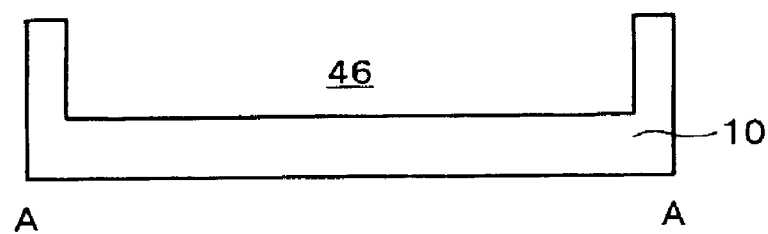
FIG. 12B is a schematic section taken along the line A—A of FIG. 12A.
Figure 12C:
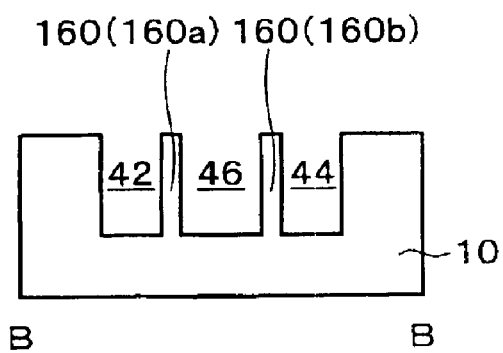
FIG. 12C is a schematic section taken along the line B—B of FIG. 12A.
Figure 13A:
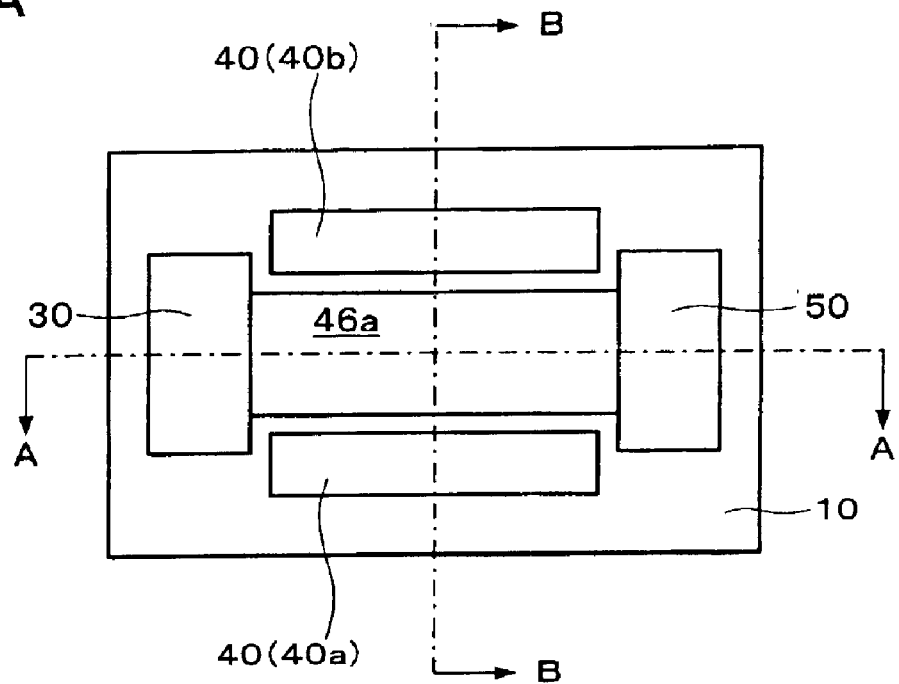
FIG. 13A is a schematic plan view showing another step in the fabrication of the organic semiconductor device of FIGS. 11A to 11C.
Figure 13B:
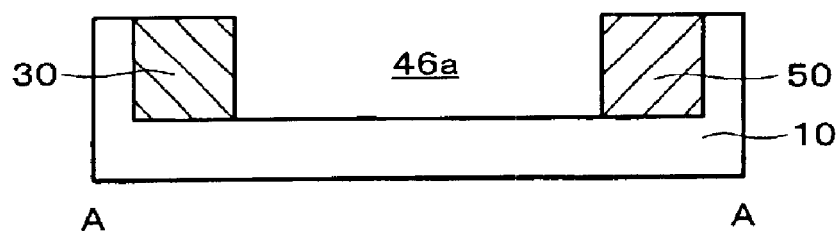
FIG. 13B is a schematic section taken along the line A—A of FIG. 13A.
Figure 13C:
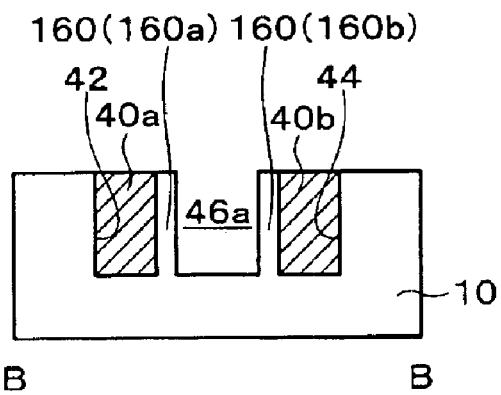
FIG. 13C is a schematic section taken along the line B—B of FIG. 13A.

The description now turns to the method of fabricating the organic semiconductor device 400 of this embodiment, with reference to FIGS. 12A–12*c* and 13A–13C. Schematic plan views of steps in the fabrication of the organic semiconductor device 400 of FIGS. 11A to 11C are shown in FIGS. 12A and 13A. A schematic section taken along the line A—A of FIG. 12A is shown in FIG. 12B and a schematic section taken along the line B—B of FIG. 12A is shown in FIG. 12C. Similarly, a schematic section taken along the line A—A of FIG. 13A is shown in FIG. 13B and a schematic section taken along the line B—B of FIG. 13A is shown in FIG. 13C. Note that the description of steps that are the same as in the fabrication process of the organic semiconductor device 100 of the first embodiment is omitted.

(1) First of all, depressions 42, 44, and 46 are formed in the substrate 10, as shown in FIGS. 12A to 12C. A method similar to that used for the first embodiment could be used for forming these depressions. The gate insulating layers 160 (160*a* and 160*b*) are formed by this process. These gate insulating layers 160 are formed by patterning of the substrate 10. In other words, these gate insulating layers 160 are made of the same material as the substrate 10.

In this case, the depression 42 is provided for the formation of the first electrode section 40*a*, of the gate electrode 40, the depression 44 is provided for the formation of the second electrode section 40*b* of the gate electrode 40, and the depression 46 is provided for the formation of the drain electrode 30, source electrode 50, and the organic semiconductor layer 80. This process ensures that the depression 42 and the depression 44 are provided facing each other.

The depression 46 is disposed facing the depression 42 with the gate insulating, layer 160*a* therebetween and also facing the depression 44 with the gate insulating layer 160*b* therebetween. Within this depression 46 will be formed the drain electrode 30 and the source electrode 50 on either side of the organic semiconductor layer 80, by a process that will be described later.

(2) The drain electrode 30, the source electrode 50, and the gate electrode 40 are then formed by embedding electrode formation material into the corresponding depressions 42, 44, and 46, as shown in FIGS. 13A to 13C. An example of this electrode formation material would be Au. An ink-jet method could be used for embedding the electrode formation material in this process. Note that a depression 46*a* is formed in the depression 46 by the formation of the drain electrode 30 and the source electrode 50, as shown in FIGS. 13A and 13B. In other words, the drain electrode 30 and the source electrode 50 are facing each other, and the depression 46*a* is formed between the drain electrode 30 and the source electrode 50. This depression 46*a* is provided for the formation of the organic semiconductor layer 80, by a process that will be described later.

(3) An organic semiconductor material is then embedded into the depression 46*a* by a method similar to that of the first embodiment. This forms the organic semiconductor layer 80 between the drain electrode 30 and the source electrode 50. The organic semiconductor device 400 (see FIGS. 11A to 11C) is obtained by the above process.

10.4 Actions and Effects

The actions and effects of the organic semiconductor device 400 of this embodiment are substantially the same as those of the organic semiconductor device 100 in accordance with the first embodiment. In addition, the drain electrode 30, the source electrode 50, and the gate electrode 40 in the organic semiconductor device 400 of this embodiment are formed by the embedding of an electrode formation material into depressions formed in the substrate 10. In particular, if these electrodes are formed by the same electrode formation material by an ink-jet method, they can be formed during, the same process. This would make it possible to further simplify the fabrication process.

The gate insulating layers 160*a* and 160*b* that insulate the gate electrode 40 and the organic semiconductor layer 80 are formed by patterning of the substrate 10 during the formation of the depressions 42, 44, and 46. This makes it possible to omit a separate process for forming the gate insulating layers.

Figure 14A:
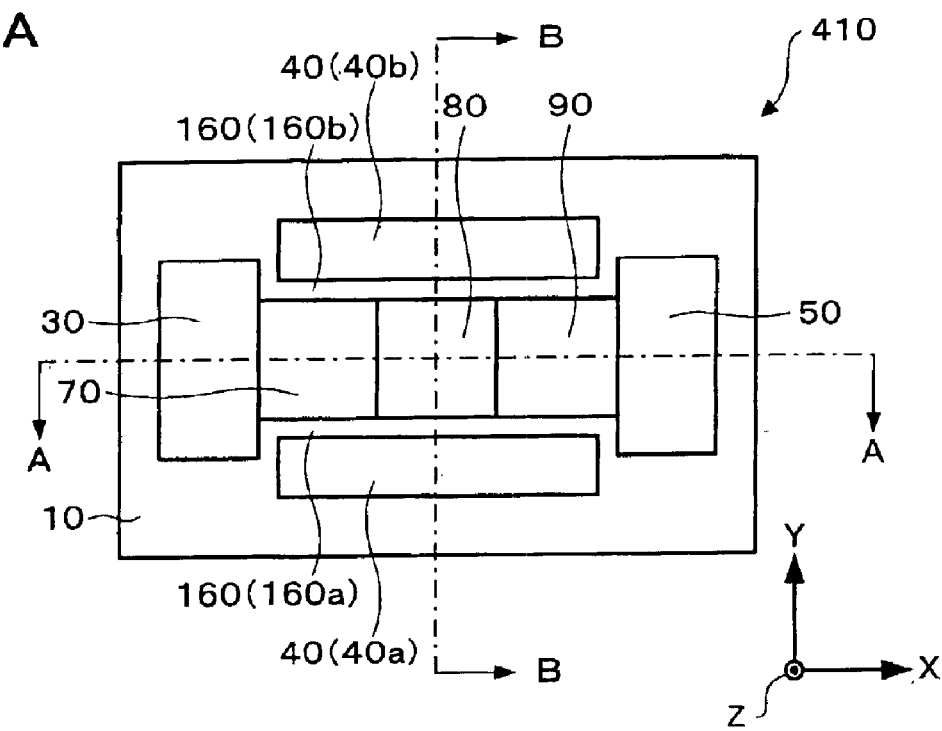
FIG. 14A is a schematic plan view of a modification of the organic semiconductor device in accordance with the fourth embodiment of the present invention.
Figure 14B:
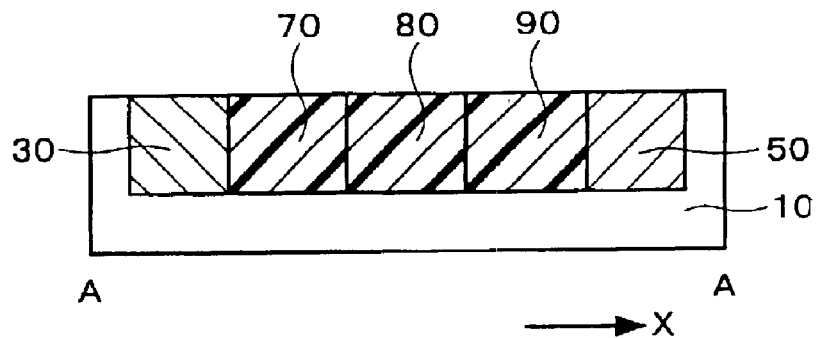
FIG. 14B is a schematic section taken along the line A—A of FIG. 14A.
Figure 14C:
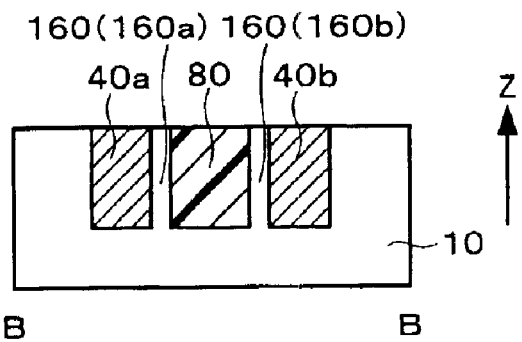
FIG. 14C is a schematic section taken along the line B—B of FIG. 14A.

Note that the organic semiconductor device 400 of this embodiment was described with reference to an example in which only the organic semiconductor layer 80 is disposed between the drain electrode 30 and the source electrode 50, as shown in FIGS. 11A to 11C, but it is also possible to dispose the hole transport/injection layer 70 and the electron transport/injection layer 90 between the drain electrode 30 and the source electrode 50 in a manner similar to that of the first to third embodiments (see FIGS. 14A to 14C).

Although the embodiments of the present invention were described above, it should be obvious to those skilled in the art that the present invention is not limited thereto and thus various modifications are possible within the scope of the invention laid out herein.

For example, the organic semiconductor device 200 of the second embodiment (see FIG. 5) was described with reference to a configuration in which the drain electrode 30 is disposed on the inner bottom surface of the depression 20 provided in the substrate 10, the organic semiconductor layer 80 is disposed on the drain electrode 30, and also the source electrode 50 is disposed on the organic semiconductor layer 80, but an alternative configuration is also possible in which a source electrode (not shown in the figure) is disposed on the inner bottom surface of the depression 20 provided in the substrate 10, an organic semiconductor layer (not shown in the figure) is disposed on that source electrode, and a drain electrode (not shown in the figure) is disposed on the organic semiconductor layer. Note that the organic semiconductor device 300 of the third embodiment could also have a similar configuration.

Similarly, the organic semiconductor device 200 of the second embodiment (see FIG. 5) was described with reference to a configuration in which the drain electrode 30 is disposed on the inner bottom surface of the depression 20, the source electrode 50 is disposed above the drain electrode 30 with the organic semiconductor layer 80 therebetween, and the gate electrode 40 is disposed on the inner sidewalls of the depression 20, but an alternative configuration is also possible in which a first electrode section (not shown in the figure) of the gate electrode is disposed on the inner bottom surface of the depression 20, a second electrode section (not shown in the figure) of the gate electrode is disposed on that first electrode section with an organic semiconductor layer (not shown in the figure) therebetween, and a drain electrode and a source electrode (not shown in the figure) are disposed on the inner sidewalls of the depression 20. Note that the organic semiconductor device 300, 400 of the third and the fourth embodiment could also have a similar configuration.

What is claimed is:

1. An organic semiconductor device comprising:
   an organic semiconductor layer disposed within a depression formed in a substrate;
   a drain electrode and a source electrode; and
   a gate electrode disposed to face the organic semiconductor layer with a gate insulating layer interposed, wherein the gate electrode is embedded in the substrate.

2. The organic semiconductor device as defined by claim 1,
   wherein the organic semiconductor layer is disposed between the drain electrode and the source electrode.

3. The organic semiconductor device as defined by claim 1,
   wherein the drain electrode and the source electrode are disposed on inner sidewalls of the depression.

4. The organic semiconductor device as defined by claim 1, wherein:
   one of the drain electrode and the source electrode is disposed above an inner bottom surface of the depression;
   the organic semiconductor layer is disposed above the electrode disposed above the inner bottom surface; and
   the other of the drain electrode and the source electrode is disposed above the organic semiconductor layer.

5. The organic semiconductor device as defined by claim 1,
   wherein the gate electrode is provided on an inner sidewall of the depression.

6. The organic semiconductor device as defined by claim 1 further comprising two gate insulating layers,
   wherein the gate electrode includes a first electrode section and a second electrode section; and
   the organic semiconductor layer is disposed between the first electrode section and the second electrode section, with the two gate insulating layers interposed between the organic semiconductor layer and the first electrode section and between the organic semiconductor layer and the second electrode section.

7. The organic semiconductor device as defined by claim 6, wherein:
   the first electrode section is disposed above an inner bottom surface of the depression;
   the organic semiconductor layer is disposed above the first electrode section; and
   the second electrode section is disposed above the organic semiconductor layer.

8. The organic semiconductor device as defined by claim 1,
   wherein at least one of the drain electrode and the source electrode is embedded in the substrate.

9. The organic semiconductor device as defined by claim 1,
   wherein the direction of a current flowing between the drain electrode and the source electrode is parallel to a surface direction of the substrate.

10. The organic semiconductor device as defined by claim 1,
    wherein the direction of a current flowing between the drain electrode and the source electrode is perpendicular to an inner bottom surface of the depression.

11. The organic semiconductor device as defined by claim 1, further comprising a hole transport/injection layer.

12. The organic semiconductor device as defined by claim 1, further comprising an electron transport/injection layer.

13. An electronic instrument comprising the organic semiconductor device as defined by claim 1.

14. An organic semiconductor device comprising:
    an insulating layer disposed above a substrate;
    an organic semiconductor layer disposed within a depression formed in the insulating layer;
    a drain electrode and a source electrode; and
    a gate electrode disposed to face the organic semiconductor layer with a gate insulating layer interposed, wherein the gate electrode is embedded in the substrate.

15. The organic semiconductor device as defined by claim 14, wherein:
    at least part of the insulating layer is disposed above one of the drain electrode and the source electrode; and
    one of the source electrode and the drain electrode is disposed above the organic semiconductor layer.

16. The organic semiconductor device as defined by claim 14,
    wherein the organic semiconductor layer is disposed between the drain electrode and the source electrode.

17. The organic semiconductor device as defined by claim 14,
    wherein the drain electrode and the source electrode are disposed on inner sidewalls of the depression.

18. The organic semiconductor device as defined by claim 14, wherein:
    one of the drain electrode and the source electrode is disposed above an inner bottom surface of the depression;
    the organic semiconductor layer is disposed above the electrode disposed above the inner bottom surface; and
    the other of the drain electrode and the source electrode is disposed above the organic semiconductor layer.

19. The organic semiconductor device as defined by claim 14 further comprising two gate insulating layers,
    wherein the gate electrode includes a first electrode section and a second electrode section; and
    the organic semiconductor layer is disposed between the first electrode section and the second electrode section, with the two gate insulating layers interposed between the organic semiconductor layer and the first electrode section and between the organic semiconductor layer and the second electrode section.

20. The organic semiconductor device as defined by claim 19, wherein:
the first electrode section is disposed above an inner bottom surface of the depression;
the organic semiconductor layer is disposed above the first electrode section; and
the second electrode section is disposed above the organic semiconductor layer.

21. The organic semiconductor device as defined by claim 14,
wherein the direction of a current flowing between the drain electrode and the source electrode is parallel to a surface direction of the substrate.

22. The organic semiconductor device as defined by claim 14, wherein:
the direction of a current flowing between the drain electrode and the source electrode is perpendicular to an inner bottom surface of the depression.

23. The organic semiconductor device as defined by claim 14, further comprising a hole transport/injection layer.

24. The organic semiconductor device as defined by claim 14, further comprising an electron transport/injection layer.

25. An electronic instrument comprising the organic semiconductor device as defined by claim 14.

* * * * *